US007965509B2

(12) United States Patent  
Campbell et al.

(10) Patent No.: US 7,965,509 B2  
(45) Date of Patent: Jun. 21, 2011

(54) HIGH PERFORMANCE DUAL-IN-LINE MEMORY (DIMM) ARRAY LIQUID COOLING ASSEMBLY AND METHOD

(75) Inventors: Levi A. Campbell, Poughkeepsie, NY (US); Richard C. Chu, Hopewell Junction, NY (US); Michael J. Ellsworth, Jr., Lagrangeville, NY (US); Maurice F. Holahan, Lake City, MN (US); Madhusudan K. Iyengar, Woodstock, NY (US); Robert E. Simons, Pouhkeepsie, NY (US); Rebecca N. Wagner, Torrance, CA (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 12/418,973

(22) Filed: Apr. 6, 2009

(65) Prior Publication Data

US 2010/0252234 A1    Oct. 7, 2010

(51) Int. Cl.  
*H05K 7/20* (2006.01)

(52) U.S. Cl. ........ 361/699; 361/704; 361/707; 361/715; 361/719; 361/720; 165/104.33; 439/196; 257/714; 257/719

(58) Field of Classification Search ............ 361/679.47, 361/679.53, 699, 704, 707, 715, 719, 720, 361/721

See application file for complete search history.

(56) References Cited

U.S. PATENT DOCUMENTS

| | | | |
|---|---|---|---|
| 4,493,010 A * | 1/1985 | Morrison et al. | 361/698 |
| 4,934,743 A | 6/1990 | Kapgan et al. | |
| 5,057,968 A * | 10/1991 | Morrison | 361/700 |
| 5,169,176 A | 12/1992 | Brossard | |
| 5,338,070 A | 8/1994 | Horikawa et al. | |
| 5,388,321 A | 2/1995 | Farrell | |
| 5,566,988 A | 10/1996 | Johnston et al. | |
| 5,662,362 A | 9/1997 | Kapgan et al. | |
| 5,740,018 A * | 4/1998 | Rumbut, Jr. | 361/720 |
| 6,421,240 B1 * | 7/2002 | Patel | 361/699 |
| 6,496,375 B2 * | 12/2002 | Patel et al. | 361/719 |
| 7,450,384 B2 * | 11/2008 | Tavassoli et al. | 361/699 |
| 7,675,748 B2 * | 3/2010 | Matsushima et al. | 361/679.53 |
| 2006/0098409 A1 * | 5/2006 | Cheon | 361/699 |
| 2008/0062652 A1 * | 3/2008 | Lieberman et al. | 361/715 |
| 2008/0084667 A1 * | 4/2008 | Campbell et al. | 361/702 |

FOREIGN PATENT DOCUMENTS

EP    0 296 003 A1    12/1988

* cited by examiner

*Primary Examiner* — Jayparakash N Gandhi  
*Assistant Examiner* — Courtney Smith  
(74) *Attorney, Agent, or Firm* — Dennis Jung, Esq.; Kevin P. Radigan, Esq.; Heslin Rothenberg Farley & Mesiti P.C.

(57) ABSTRACT

A method and associated assembly for cooling electronic heat generating components of a computer including dual-in-line memory (DIMM) array(s) is provided. The assembly comprises a cooling component having a plate with a first and a second (reverse) side, thermally coupling to the heat generating components including the DIMM array(s). The first plate side has a coolant conduit connected at one end to a supply manifold via flexible tubing and at another end to a return manifold via another flexible tubing such that when coolant is supplied, the coolant circulates from the supply manifold to the return manifold by passing through said first plate's conduit.

20 Claims, 10 Drawing Sheets

HIGH PERFORMANCE DUAL-IN-LINE MEMORY (DIMM) ARRAY LIQUID COOLING ASSEMBLY AND METHOD

TECHNICAL FIELD

This invention relates to cooling of computing systems environments and more particularly large computing systems environments that include one or more servers.

BACKGROUND OF THE INVENTION

The industry trend has been to continuously increase the number of electronic components inside computing systems. Given the limited footprint of many computing systems, a continuous increase in the number of heat generating components creates challenging heat dissipation issues. These issues if not dealt with adequately can harm the structural and data integrity of the computer system, making the effect felt both at a system and module level.

Most electronic packages or nodes in large environments are housed in stacks disposed in frames that resemble racks or cages. Traditionally, these electronic packages have been cooled by forced air cooling using air moving devices, such as fans and blowers, selectively disposed somewhere in the environment as to allow optimum air flow. These air moving devices are often designed to displace hot air away from the components by creating parallel air flow paths that circulate through the rack or cage like frame or structure.

As the packaging densities increase, however, the air cooling solutions are becoming more prohibitive and costly. In recent years, one particular area of focus has been dedicated to cooling high heat flux microprocessor modules. With an increase in bandwidth and server throughput, large amounts of on-board memory are required to achieve increased performance. As the amount of memory in servers increases so does the number of standard memory packages such as dual in-line memory modules (hereinafter DIMMs). In addition, each package often has increasing power dissipation and tighter DIMM row spacing associated with it. Memory modules can contribute as much as 50% of the total server heat load. As is known, increased power dissipation requires a higher airflow for traditional air cooled servers if the maximum DIMM temperature dictated by reliability is unchanged. Although some enhanced DIMM cooling schemes have been proposed in the art, they do not allow for addition or replacement of DIMMs.

In recent years, direct or indirect liquid cooling has become a more attractive option for the designers of computing systems. Conduction cooling by a liquid cooled structure has been shown to be substantially less burdensome both in terms of energy costs and resource allocations, especially for use in data centers. The prior art currently being practiced, however, whether air cooled or water cooled is limited in its offerings. It is a concern that current methods being used cannot adequately provide for future generation designs especially when it comes to cooling memory packages such as DIMMs. Consequently, a solution is needed that can extend beyond current systems designs and can be practically applicable in fabrication of future generation environments.

SUMMARY OF THE INVENTION

The shortcomings of the prior art are overcome and additional advantages are provided through the provision of a method and associated assembly for cooling electronic heat generating components of a computer including dual-in-line memory (DIMM) array(s) is provided. The assembly comprises a cooling component having a plate with a first and a second (reverse) side, thermally coupling to the heat generating components including the DIMM array(s). The first plate side has a coolant conduit connected at one end to a supply manifold via flexible tubing and at another end to a return manifold via another flexible tubing such that when coolant is supplied, the coolant circulates from the supply manifold to the return manifold by passing through said first plate's conduit.

In an alternate embodiment of the present invention, a plurality of DIMMs and cooling components are provided. Each coolant component is disposed so that the plates flank the DIMM arrays. Coolant circulates through all the cooling components via a common supply and return manifold connected to the conduits of the first plate via a plurality of flexible tubing's.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3 is a schematic illustration of electronic components disposed on a printed circuit board, in accordance with an aspect of the present invention;

DETAILED DESCRIPTION OF THE INVENTION

Figure 1:
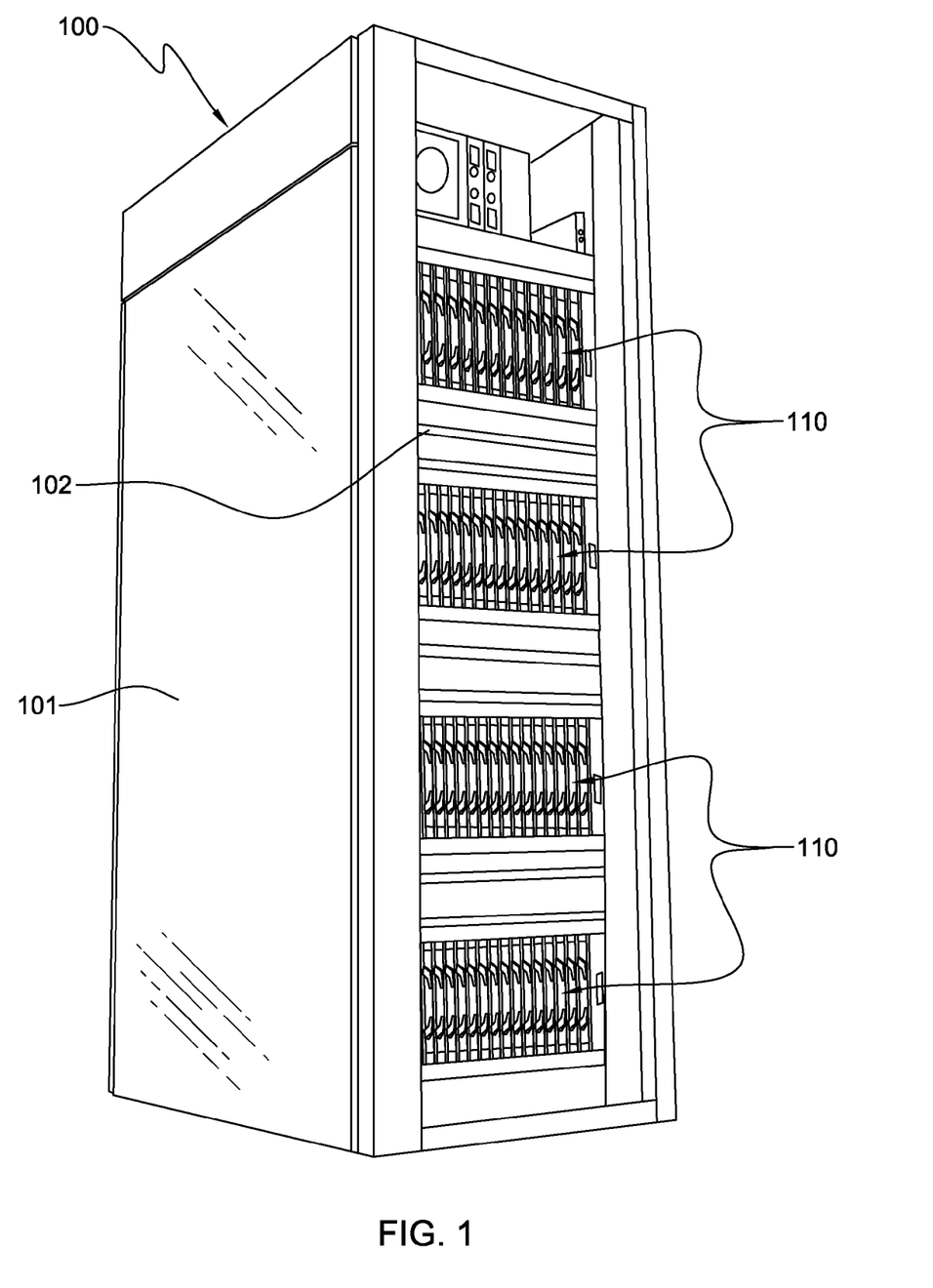
FIG. 1 is a perspective view illustration of a computer housing having a rack frame, in accordance with an aspect of the present invention.

FIG. 1 is a perspective view illustration of a computer environment comprising of a housing 100, having a frame 102, preferably with a rack or cage like structure as shown. The housing 100 can also incorporate full or partial doors or covers such as referenced by numerals 101.

It should be noted that as used herein, the term computer or electronic rack 102, hereinafter will be used for ease of reference but can be construed to include any housing, frame, rack, compartment, blade server system or other structural arrangements including any that may incorporate doors and/or covers. In addition, the computer rack 102 can be either a stand alone computer processor or a sophisticated system, having high, mid or low end processing capability.

In one embodiment, an electronics rack may comprise multiple electronic system chassis, each having one or more heat generating electronics systems disposed therein requiring cooling. In different embodiments, an electronic system chassis may be a multi-blade center system 110 with each blade being removable and stackable inside the rack 102. The electronic rack 102 comprises a stack of electronic system chassis or multi-blade center systems 110, as well as supporting power supplies, networking equipment and other similar and necessary components, not individually illustrated.

Figure 2:
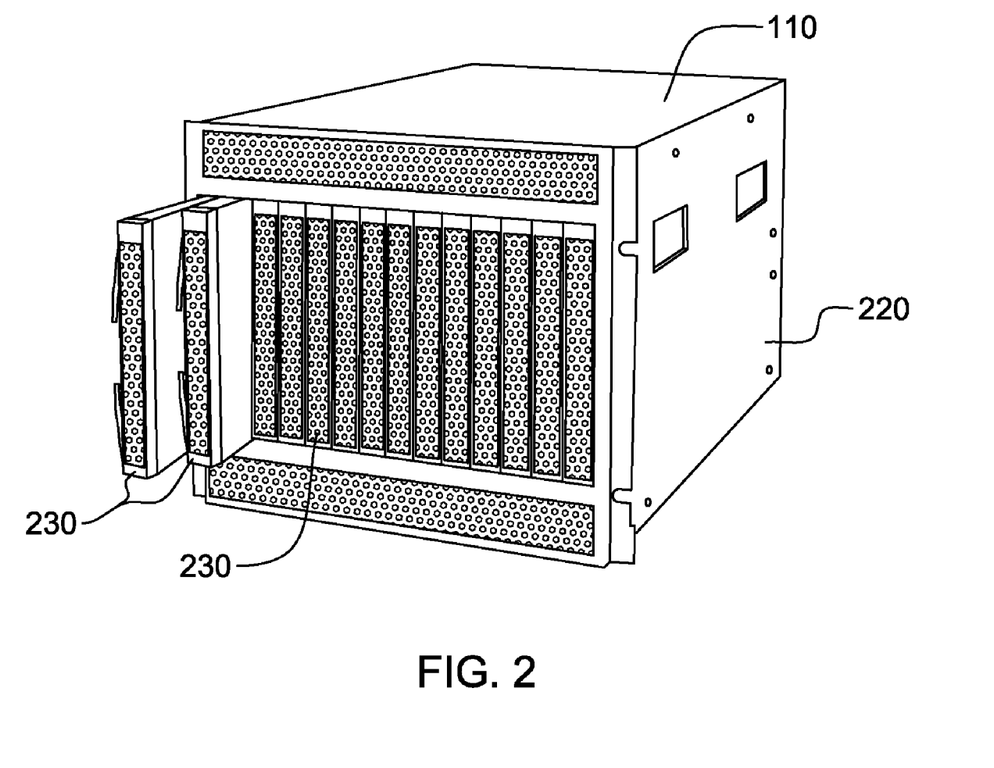
FIG. 2 provides a perspective view of a computing environment using removable subsystems and nodes such as blades systems, in accordance with an aspect of the present invention.

FIG. 2 provides a perspective view of a multi-node or multi-blade center 110, such as shown in FIG. 1, one example of which is marketed by International Business Machines Corporation, of Armonk, N.Y. By way of specific example, multi-blade system 110 may comprise a stand alone server system which incorporates scalable computing functionality up to, for example, fourteen high performance blades. In some embodiments the system can include multiple removable nodes or blades 230 and system chassis 220. The blades 230 in the figure are shown to be disposed in a vertical direction. This is only for illustrative purposes, however, and in some embodiments, the blades 230 may also be disposed horizontally.

FIG. 3 is a schematic illustration of a package with electronic components, such as the blade system 230 discussed in conjunction with FIG. 2. In this figure each package or blade can include multiple processors and can be a complete computer system having systems and/or subsystems that can include Direct Access Storage Devices (DASDs) 341 and Dual In-Line Memory Modules (DIMMs) 342. Corresponding electrical connectors 343 can be provided connecting these blades 230 to respective electronic system chassis 220. These connectors are typically disposed near the back of the chassis for making electrical connection to connectors when the blade is inserted into the chassis in operational position.

Figure 4:
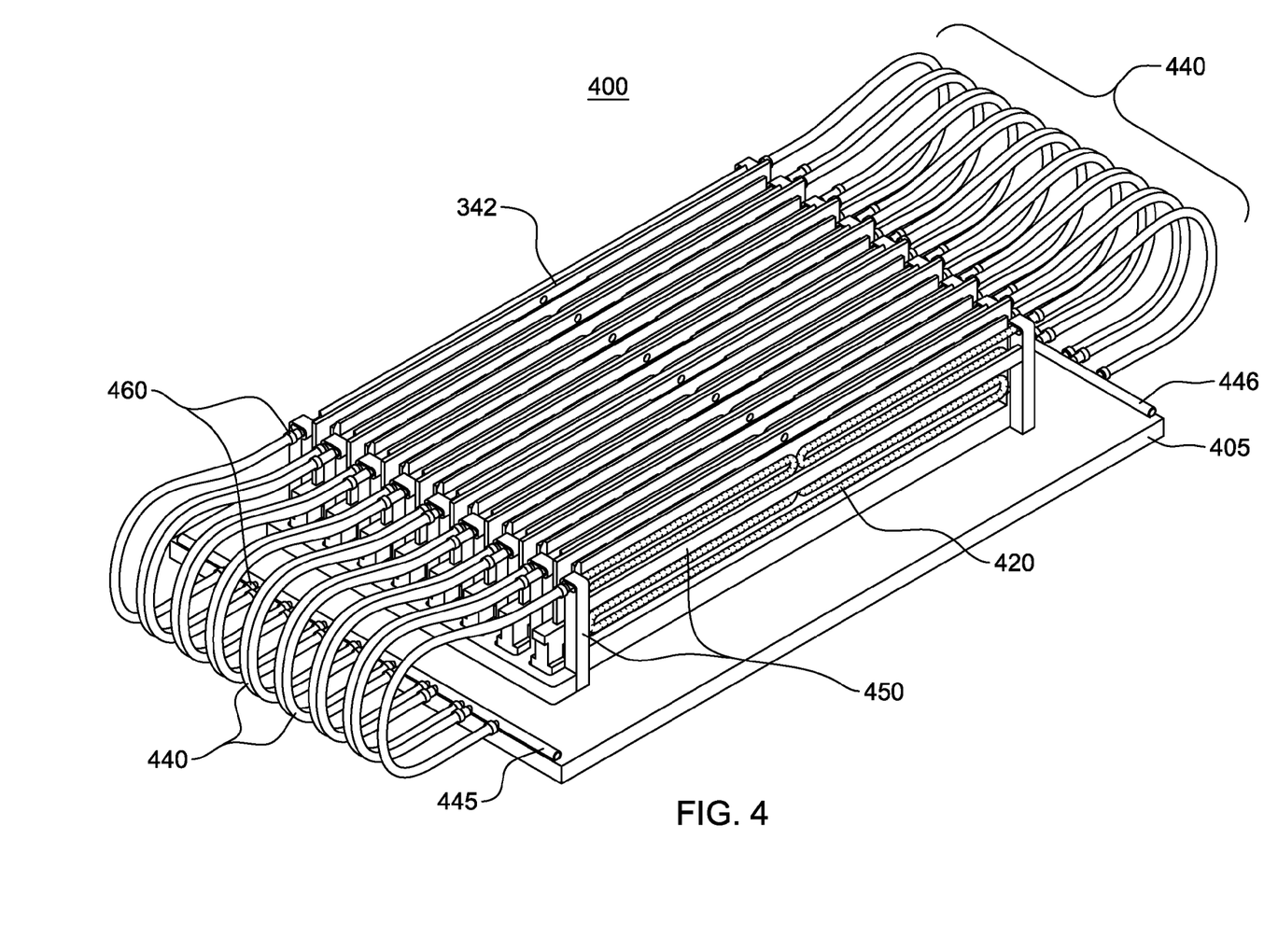
FIG. 4 is a perspective view illustration of a liquid cooling assembly as per one embodiment of the present invention.

In prior art, air cooled components such as the DIMMs and DASDs shown in FIG. 3, were becoming so closely packed and so numerous that air cooling systems were becoming cost prohibitive. FIG. 4 provides one embodiment of the present invention where a solution is provided to facilitate liquid cooling of arrays such as DIMMs while maintaining the advantage of field replacement of individual DIMMs and other arrays.

Referring to FIG. 4, a perspective illustration of liquid cooling assembly 400 is provided as per one embodiment of the present invention. The heat generating component can comprise arrays. Illustratively these to be cooled arrays are provided as DIMM arrays in the present embodiment and referenced by numerals 342. The arrays are disposed on a circuit board or motherboard 405 as shown. Each array is then cooled by a cooling component, referenced as 420. The cooling component 420 is cooled via coolant delivered from a supply manifold 445. The coolant circulates through the coolant component 420 and is ultimately returned via a return manifold 446. The coolant component connects to both supply and return manifolds 445/446 via flexible tubing 440. In the illustration of FIG. 4, an array consisting of a plurality of DIMMs and coolant components are provided so more than one pair of flexible tubing 440 is shown. In this embodiment, a common supply manifold (collectively still referenced as 445) is used to supply coolant to the plurality of coolant components 420 and a single common return manifold 446 is also used in the same manner, but other arrangements can be provided in alternate embodiments. In a preferred embodiment, the cooling component 420 further comprises of cooling plates thermally coupled to heat dissipating components on the DIMMS as will be discussed in more detail. In addition, in this preferred embodiment, to provide constant and continuous contact between the plate(s) and active components, contact means such as springs or other elements as known to those skilled in the art are provided. The springs are not illustrated in this figure. The springs will be attached to each cooling plate as will be discussed below.

The flexible tubing 440 provide the advantage of easy removal and installation of DIMMs or other similar arrays because the flexibility of these tubing's 440 allow at least some movement during such removal/installation process. In one embodiment, the flexible tubing's 440 can then be contrasted against a stable support system 450 that can be otherwise rigidly fixed to the circuit board or motherboard 405.

When a plurality of cooling components is used in connection with a plurality of DIMM arrays, the plates as illustrated flank the arrays as shown.

Figure 5:
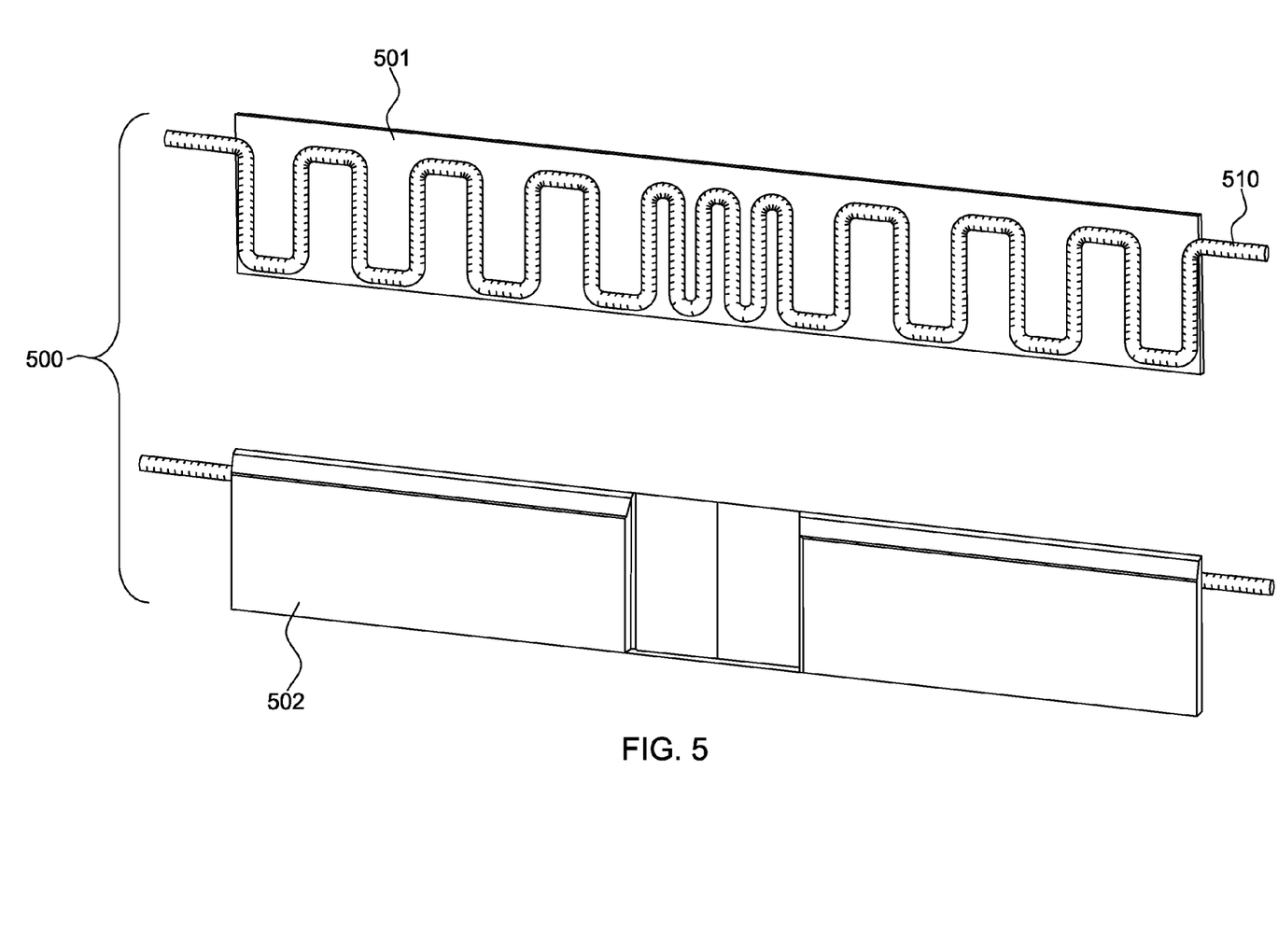
FIG. 5 is a detail illustration of the cooling components as provided by the embodiment of FIG. 4, in accordance with an aspect of the present invention.

FIG. 5 provides for a more detailed illustration of the cooling component 420. As stated, in a preferred embodiment, at least one plate having a first side and a second reverse side will be used per each to be cooled DIMMs or other array/components. The illustration of FIG. 5 shows these two sides of plate 500. For ease of reference each of the two sides of plate 500, are hereinafter referenced separately as first side 501 and second (reverse) side 502, as shown in FIG. 5.

A variety of manufacturing methods as known to those skilled in the art can be provided. In one example, shown in FIG. 5, conduit 510 is made from a variety of rigid materials such as copper and is secured to or into a thin metal plate, preferably of aluminum. The conduit pattern provided is multi-serpentine in shape but can be varied selectively to accommodate heat dissipation needs. For example, in the illustration provided, the pattern is denser at the center to provide more cooling relief to those pinpointed areas.

The second or opposite/reverse side of the plate 502 is substantially flat in surface but again, it can be selectively designed to fit securely with its surroundings. In the figure provided, for example, some thickness variations are shown intentionally to address such design variations. This possible varied thickness of the second side 502 is to accommodate DIMM or other components heights, for example.

In addition, inlet and outlets may also be provided on same or opposite ends of the plate 500. Alternate designs can include flat tubing the size of the cold plate with possible internal features (skiving or other similar designs).

Figure 6:
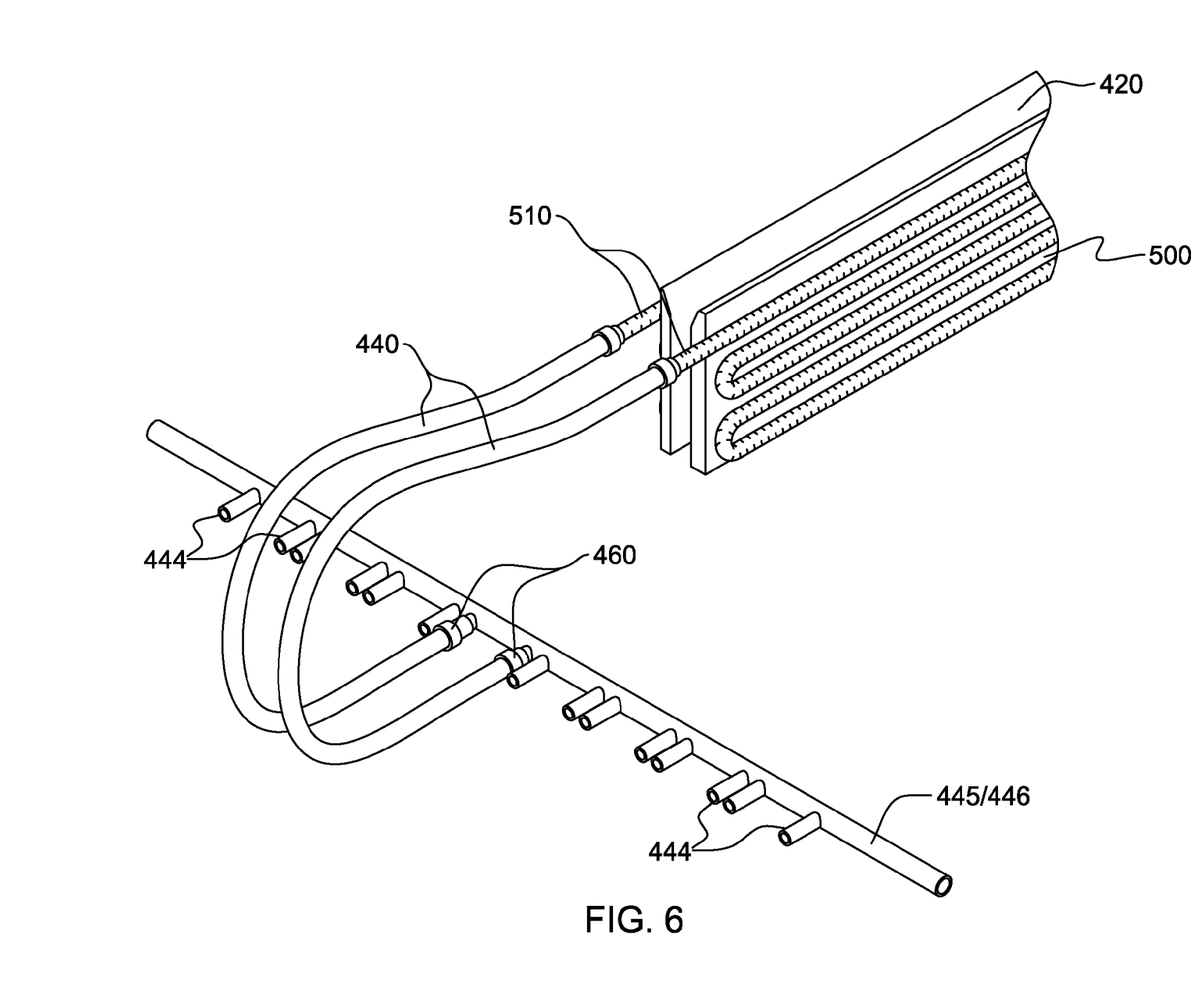
FIG. 6 is a detail illustration showing SMA rings as per embodiment of FIG. 4, in accordance with an aspect of the present invention.

FIG. 6 illustrates further details about the connectivity of the cooling plates 500 to the tubing 440 as discussed earlier. In the illustration of FIG. 6, the cold plate pair that comprises the cooling component 420 is disposed on each side of the DIMM array (not visible in this drawing). Flexible tubing 440 supplies coolant- to the conduits 510 from the coolant manifold 445. In this embodiment, a common coolant manifold with a plurality of individual connections 444 is provided to connect to a plurality of flexible tubing's as shown. A similar design can also be employed to connect a variety of flexible tubing's to the return manifold 446. Consequently, in the illustration of FIG. 6, the manifold is referenced as 445/446.

As stated earlier, the use of flexible tubing 440 allows cold plates 500 to freely translate horizontally when disposed so as to allow DIMMs to be inserted and removed easily. In the illustration of FIG. 6, to connect the coolant supply manifold to the flexible tubing 440, shape memory alloys (hereinafter SMA) rings 460 are used to prevent leaks, although other sealing means can also be employed as known to those skilled in the art. In a preferred embodiment, as shown in FIG. 6 a barb design is implemented in providing the connection. As stated in connection to the discussion of FIG. 4, in this embodiment, all tubing connects to a common supply and return manifold (445/446). Therefore any discussion regarding the common supply manifold 445 is similar to implementations used for common return manifolds 446.

The length of the tubing is variable and can be selectively adjusted to fit particular needs. For example, the length of tubing in FIG. 6 may appear somewhat exaggerated in applications that involve dense packaging. In addition, the material used to fabricate the tubing can also be altered as known by those skilled in the art. The diameter of the tubing can also be increased or decreased to control flow of coolant depending on amount of heat dissipation of the components. In a preferred embodiment, for example, FEP or fluorinated ethylene-propylene, (Teflon®) tubing is used with a bend radius of approximately ¾" making it very versatile for the particular suggested use and application.

Figure 7:
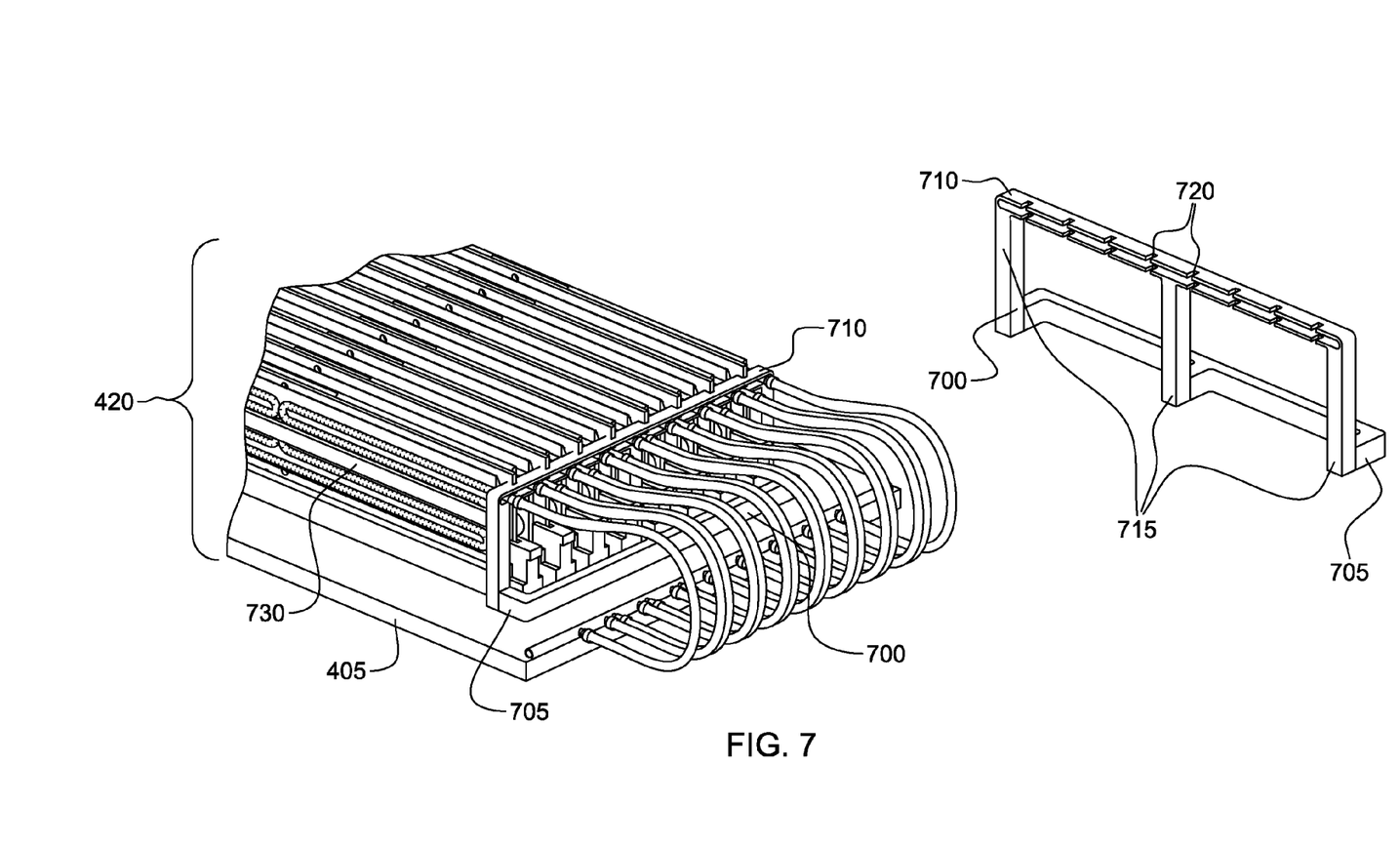
FIG. 7 provides for an embodiment of the present invention incorporating a support element.

FIG. 7 is an illustration of an embodiment of the present invention where additional supports are provided to the cooling assembly (400 of FIG. 4). Cold plates 420 can be supported solely by their copper inlet and outlet tubes, which rest in the horizontal slot 710 of a support element 700. The support element is to provide additional structural support to the assembly 420. In FIG. 7, the support element 700 can span the entire span of the assembly 400. The support element 700 comprises of a horizontal securing portion 705 which can be directly attached to a motherboard or circuit board 405, and a single horizontal segment 710 that is connected to the securing portion 705 via vertical guide components 715. Furthermore, a plurality of vertical guide slots 720 is provided in the horizontal segment 710 of support 700 to provide alignment for DIMMs. A side support 730 is also provided which is mostly used to provide for spring actuation (also discussed in conjunction with FIGS. 4, 9 & 10).

Figure 8:
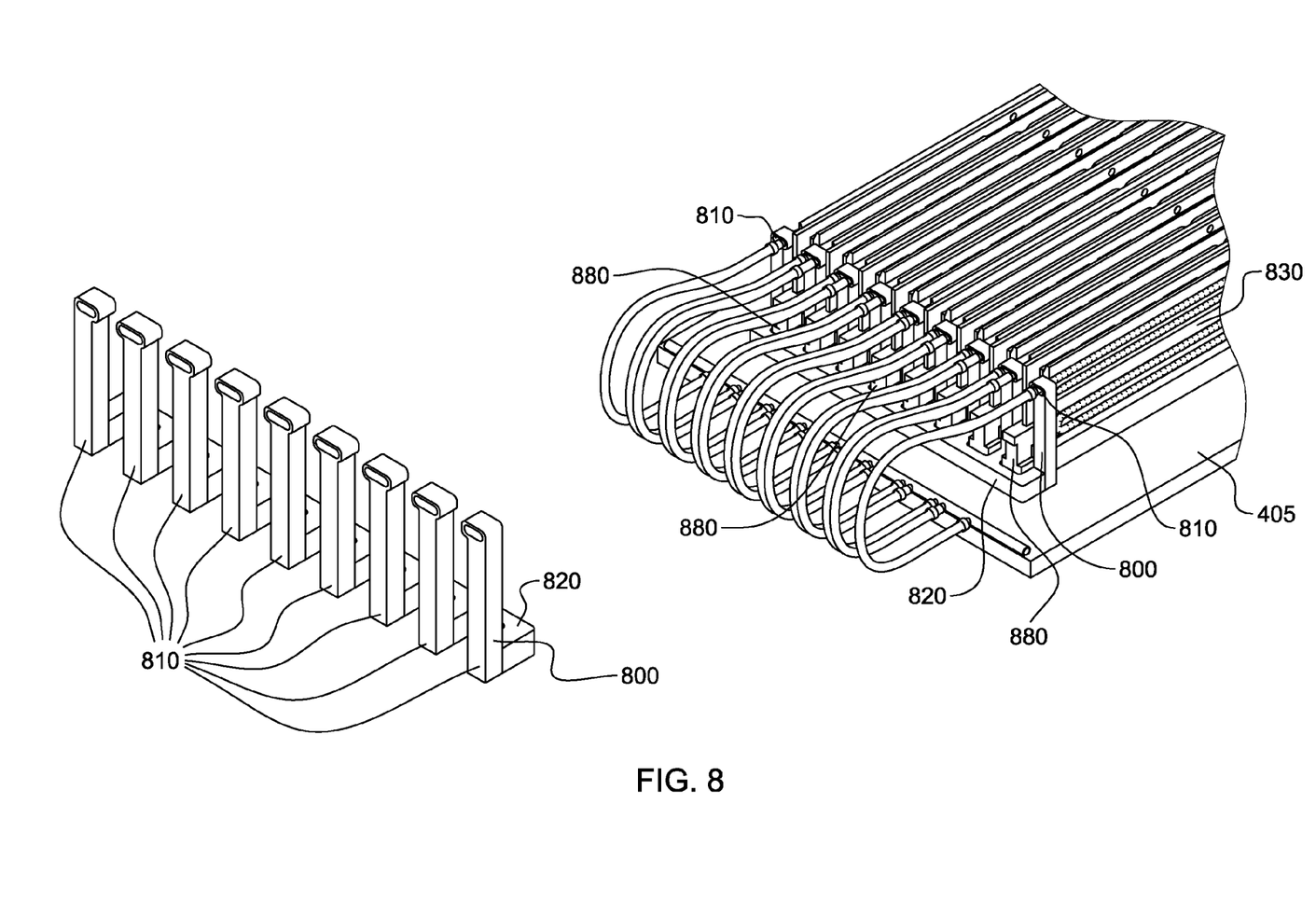
FIG. 8 provides for an alternate embodiment of the present invention incorporating a support component.

FIG. 8 is an illustration of an alternate support element design. In FIG. 8, a support component 800 is provided having multiple vertical supports members 810 and a single horizontal member 820 which is directly secured to the motherboard 405. This design provides easier finger access, especially to the release lever and DIMM edges. The plurality of vertical support members 810 are joined around the base of connectors 880 to add structural integrity and lessen the number of holes for attaching to the motherboard 405. This detail does not interfere with the existing DIMM release lever, though an extension can be implemented. Side supports 830 are provided at the ends rather than between cold plates for spring actuation (as will be discussed).

Figure 9:
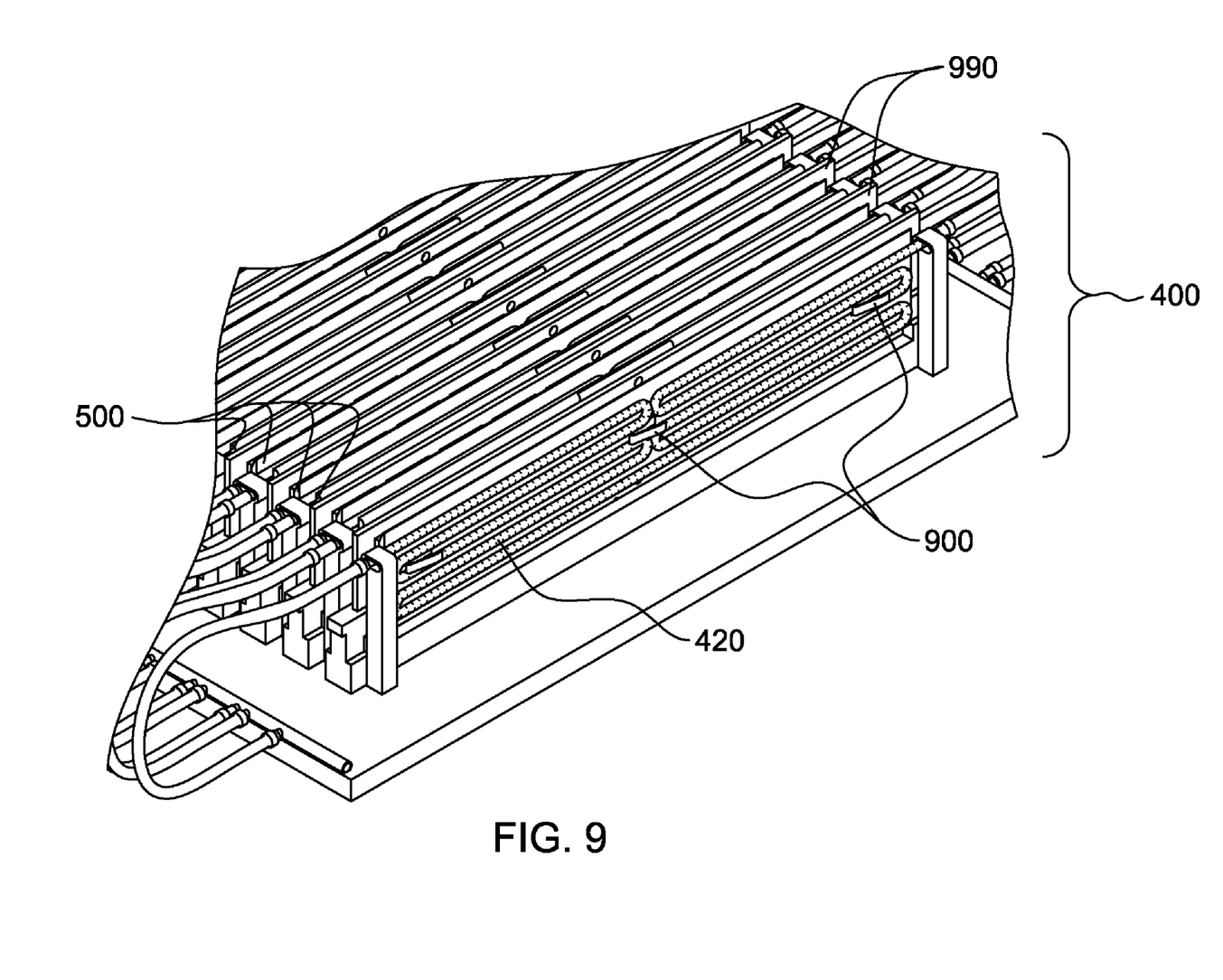
FIGS. 9 & 10 are different perspectives of one embodiment of the present invention that incorporates contact means such as spring mechanism in its cooling assembly, in accordance with an aspect of the present invention.
Figure 10:
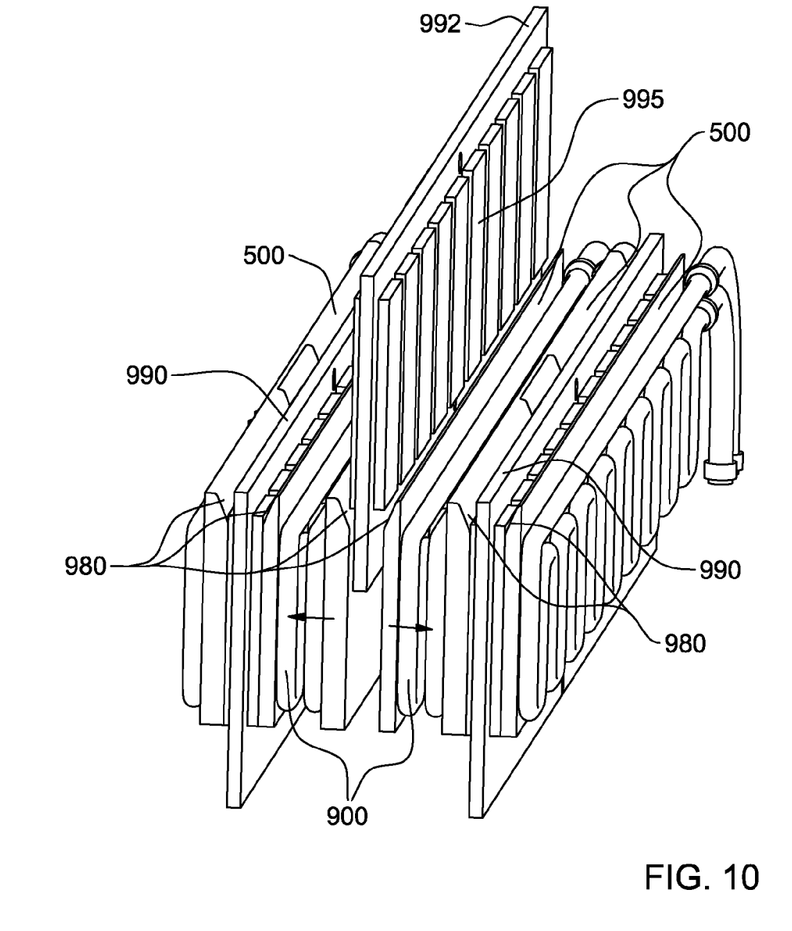

FIGS. 9 & 10 provide—details on the spring actuation mechanism. FIG. 9 is an illustration of the mechanism, showing the cold plate assembly 420 while the side view illustration of FIG. 10 provides a closer look of the spring mechanism without showing much of the assembly 420. Both figures can be taken together to provide a full understanding of the mechanisms.

In the embodiment shown by FIGS. 9 & 10, a single spring or a set of springs 900 is/are located between each pair of cooling plates 500 and provides a small amount of force to maintain contact between cold plates 500 and DIMMs 990 such that each DIMM 990 is contacted by a cooling plate from either side. In a preferred embodiment, small v-springs 900, as shown are provided but any other kind of compression springs of appropriate length may be used alternatively as known by those skilled in the art. These can also be provided in conjunction with side supports of embodiments of FIGS. 7 & 8.

In the case provided in FIG. 9, because the cold plates 500 constantly push away from one another, no actuation device is needed. In a preferred embodiment, a leading chamfered edge 980 (FIG. 10) allows for DIMM 990 placement without damaging components. As a DIMM 990 is inserted between a pair of cold plates, those two cold plates 500 give way and translate horizontally away from one another. Alternatively, springs 900 can be replaced with wedges that can be actuated to provide force. This removes the potential for DIMMs 990 to stick to the cold plates 500 and reduces the force on DIMMs 990 during installation. However, a dummy DIMM referenced as 992 (as shown illustratively in FIG. 10) may be inserted where an actual DIMM is removed to keep the spring loads evenly distributed. In an alternate embodiment, an interface pad may be added directly to DIMM 990 components for height tolerance, and since DIMMs 990 are removable it can be easily replaced. Also, a release liner material such as the one shown in FIG. 10 and referenced as 995 may potentially added to prevent sticking between pad and cold plate.

Figure 11:
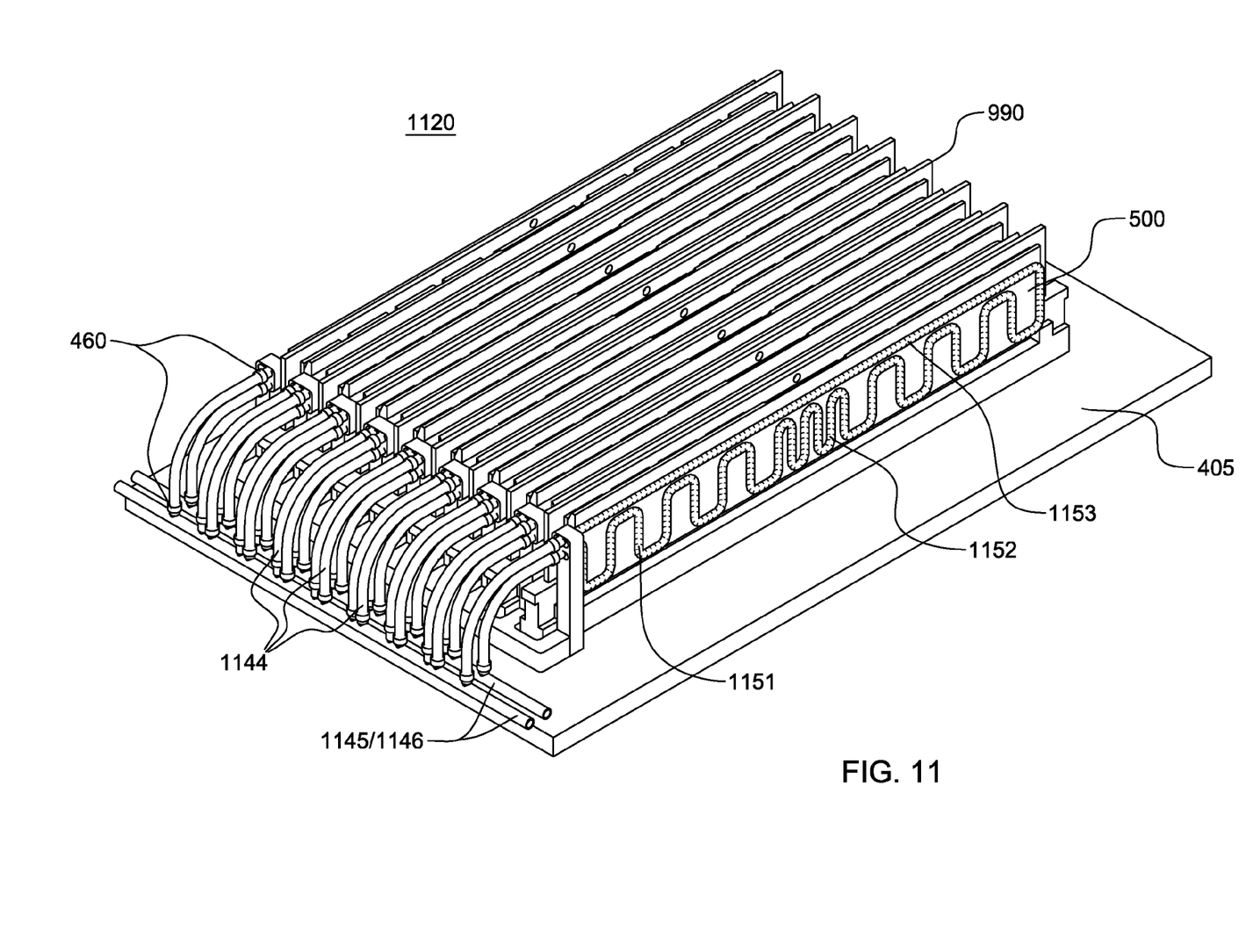
FIG. 11 is a perspective view of an alternate embodiment of the present invention with supply and return manifolds being disposed on the same side of the cooling assembly, in accordance with an aspect of the present invention.

FIG. 11 provides for an alternate embodiment of a cooling assembly referenced as 1120. In this embodiment, both the inlets and outlets 1145/1146, and all tubing 1144, are disposed on one end of the assembly 1120. This design may be preferable in some cases. However, it also has certain drawbacks. For example this assembly requires a separate support design for the far end and makes accessing the release levers more difficult at the near end. Other design elements such as that of the cold plates 500 and SMAs 460 remain substantially the same and therefore bear the same numerical references. However, the cold plate coolant conduits, now referenced as 1151 require a different design as these have to now attach to manifolds disposed on the same side. This explains the serpentine portion 1152 and the return portion 1153 of the conduit 1152 as shown. The same kind of materials can be used for the different components of the alternate embodiment of FIG. 11 as was discussed in conjunction with the embodiment of FIG. 4. As with respect to the coolants used, a number of liquid coolants can be used in connection with the present invention as will be discussed below. Some examples will be enumerated below with the understanding that this is not an exhaustive list and many other examples can be used as known to those skilled in the art. One example of a liquid coolant could be water. Other examples may comprise a fluorocarbon or segregated hydrofluoroether liquid such as FC-86, FC-87, FC-72, HFE-7000, HFE-7100, or FE-7200 (each of which is available from 3M Corporation, St. Paul Minn.). Fluorocarbon liquid typically boils at 30° C.-80° C. at atmospheric pressure, while water boils at 100°.

While the preferred embodiment of the invention has been described, it will be understood that those skilled in the art, both now and in the future, may make various improvements and enhancements which fall within the scope of the claims which follow. These claims should be construed to maintain the proper protection for the invention first described.

What is claimed is:

1. An assembly for cooling electronic heat generating components of a computer including dual-in-line memory (DIMM) array(s), comprising:

a cooling component comprising a plate with a first main side and a second main side, first main side of the plate being thermally coupled to one or more of the heat generating components including the DIMM array(s);

a coolant conduit coupled to the second main side of the plate, the coolant conduit being connected at one end to a supply manifold via a first flexible tubing and at another end to a return manifold via a second flexible tubing such that when coolant is supplied, the coolant circulates from the supply manifold to the return manifold by passing through said first plate's coolant conduit coupled to the second main side of the plate, wherein the plate is a thermally conductive plate; and at least one spring secured to the second main side of the plate to facilitate thermal coupling of the first main side of the plate to the one or more heat generating components including the DIMM array(s).

2. The assembly of claim 1, wherein said cooling conduit is multi-serpentine in shape.

3. The assembly of claim 1, wherein shape of the coolant conduit tailored to provide a varying cooling function across the first main side of the plate to address varying heat dissipation needs of the one or more of the heat generating components including the DIMM array(s) thermally coupled thereto.

4. The assembly of claim 1, wherein at least one DIMM array of the DIMM array(s) is physically coupled to said second main side of the plate.

5. The assembly of claim 1, wherein the first main side of the plate thermally coupled to the one or more of the heat generating components including the DIMM array(s) is substantially flat.

6. The assembly of claim 1, wherein thickness variations are provided in the plate to selectively mold the first main side of the plate to adjacent heat generating components and facilitate addressing heat dissipation needs of the one or more of the heat generating components including the DIMM array(s) thermally coupled thereto.

7. The assembly of claim 1, wherein the supply and return manifolds are disposed at opposite ends of the assembly, adjacent to opposite end edges of the plate.

8. The assembly of claim 1, wherein the supply and return manifolds are disposed at a same end of said assembly, adjacent to a same end edge of the plate.

9. The assembly of claim 1, wherein the at least one spring provides constant and continuous contact between the first main side of the plate and the one or more of the heat generating components including the DIMM array(s) thermally coupled thereto.

10. The assembly of claim 1, wherein the assembly further comprises a plurality of springs secured to the second main side of the plate to facilitate thermal coupling of the first main side of the plate to the one or more heat generating components including the DIMM array(s).

11. The assembly of claim 10, wherein the coolant conduit is coupled to the second main side of the plate around the plurality of springs secured to the second main side of the plate.

12. The assembly of claim 1, wherein the length of the first and second flexible tubing is tailored to provide easy removal and installation of components.

13. The assembly of claim 1, wherein shape memory alloys (SMA) are used to provide leak free connections between the supply and return manifolds and the first and second flexible tubings.

14. The assembly of claim 13, wherein said SMAs are secured to the supply and return manifolds and the first and second flexible tubings via a barb design implementation.

15. The assembly of claim 1, wherein an interface pad is disposed between the DIMM array(s) and the cooling component to provide enhanced thermal contact between the first main side of the plate and the one or more of the heat generating components including the DIMM array(s).

16. The assembly of claim 1, wherein the coolant conduit substantially comprises copper and the plate substantially comprises aluminum.

17. An assembly for cooling electronic heat generating components of a computer including a plurality of dual-in-line memory (DIMM) arrays, comprising:

a plurality of cooling components, each cooling component comprising a plate with a first main side and a second main side, the first main side of each plate being thermally coupled to a respective DIMM array of the plurality of DIMM arrays, and wherein at least one DIMM array is disposed between and thermally coupled opposing first main sides of two adjacent cooling components of the plurality of cooling components;

a plurality of coolant conduits, each coolant conduit being coupled to the plate of a respective cooling component of the plurality of cooling components, and each coolant conduit being connected at one end to a common supply manifold via a first flexible tubing and at another end to a common return manifold via a second flexible tubing such that when coolant is supplied, the coolant circulates from the supply manifold to the return manifold by passing through the plurality of coolant conduits coupled to the second main sides of the plates of the plurality of cooling components; and a plurality of springs, at least one spring of the plurality of springs being coupled to the second main side of each plate of the two adjacent cooling components with the opposing first main sides of the plates between which the at least one DIMM array is disposed, wherein the plurality of springs facilitate thermal coupling of the at least one DIMM array to the opposing first main sides of the two adjacent cooling components of the plurality of cooling components.

18. The assembly of claim 17, further comprising a support element spanning an entire length of the assembly, the support element comprising a horizontal securing portion for attachment to circuit boards electronically connected to the plurality of DIMM arrays; and a single horizontal segment via vertical guide components having vertical guide slots to provide alignment for the plurality of DIMM arrays.

19. The assembly of claim 17, comprising a support component spanning an entire length of the assembly, the support component comprising a horizontal member and a plurality of vertical support members joined around a base of connectors and enabled each to be directly secured to any circuit board electronically connected to the plurality of DIMM arrays.

20. A method for cooling electronic heat generating components of a computer including a plurality of dual-in-line memory (DIMM) arrays, the method comprising:

thermally coupling a plurality of cooling components to the plurality of DIMM arrays, each cooling component comprising a plate with a first main side and a second main side, the first main side of each plate being thermally coupled to a respective DIMM array of the plurality of DIMM arrays, and wherein at least one DIMM array is disposed between and thermally coupled to opposing first main sides of two adjacent cooling components of the plurality of cooling components;

providing for circulation of coolants by providing a plurality of coolant conduits, each coolant conduit being coupled to the second main side of a plate of a respective cooling component of the plurality of cooling components, and each coolant conduit being connected to a common supply manifold via a first flexible tubing and to a common return manifold via a second flexible tubing; and providing a plurality of springs, wherein at least one spring of the plurality of springs is coupled to the second main side of each plate of the two adjacent cooling components with the opposing first main sides of the plates between which the at least one DIMM array is disposed, wherein the plurality of springs facilitate thermal coupling of the at least one DIMM array to the opposing first main sides of the two adjacent cooling components of the plurality of cooling components.

* * * * *